United States Patent [19]

Wang et al.

[11] Patent Number: 5,369,609
[45] Date of Patent: Nov. 29, 1994

[54] FLOATING GATE MEMORY ARRAY WITH LATCHES HAVING IMPROVED IMMUNITY TO WRITE DISTURBANCE, AND WITH STORAGE LATCHES

[75] Inventors: Ping Wang, Saratoga; Ching-Shi Jenq, San Jose, both of Calif.

[73] Assignee: Silicon Storage Technology, Inc., Sunnyvale, Calif.

[21] Appl. No.: 974,787

[22] Filed: Nov. 12, 1992

Related U.S. Application Data

[63] Continuation-in-part of Ser. No. 851,080, Mar. 13, 1992, Pat. No. 5,289,411.

[51] Int. Cl.$^5$ .............................. G11C 7/00; G11C 8/00
[52] U.S. Cl. .................... 365/185; 365/182; 365/189.05; 365/230.08; 365/238.5
[58] Field of Search ............ 365/185, 182, 189.05, 365/230.08, 218, 189.11, 177, 238.5

[56] References Cited

U.S. PATENT DOCUMENTS

| | | | |
|---|---|---|---|
| 4,698,787 | 10/1987 | Mukherjee et al. | |
| 4,785,424 | 11/1988 | Lin et al. | 365/185 |
| 4,887,242 | 12/1989 | Hashimoto | 365/185 |
| 5,029,130 | 7/1991 | Yeh . | |
| 5,101,379 | 3/1992 | Lin et al. | 365/195 |
| 5,218,569 | 6/1993 | Banks | 365/45 |

OTHER PUBLICATIONS

U.S. Ser. No. 07/682,459 filed on Apr. 9, 1991, Yeh et al.

Primary Examiner—Viet Q. Nguyen
Attorney, Agent, or Firm—Limbach & Limbach

[57] ABSTRACT

An electrically programmable and erasable floating gate memory device has two substantially identical sections. Each section has a plurality of column address lines, a plurality of row lines and a plurality of source lines. A first plurality of floating gate memory cells has its drain connected to a different one of the column address line, its gate connected to the same first row line and its source connected to the same first source line. A second plurality of floating gate memory cells has its drain connected to a different one of the column address line, its gate connected to the same second row line, different from the first row line, and its source connected to the same first source line. Associated with each section is a plurality of bit latches, one for each column. Reprogramming data is stored in the bit latches. Data from the bit latches of one section are stored in the first plurality of floating gate memory cells. Data from the bit latches of the other section are stored in the second plurality of floating gate memory cells.

15 Claims, 4 Drawing Sheets

FLOATING GATE MEMORY ARRAY WITH LATCHES HAVING IMPROVED IMMUNITY TO WRITE DISTURBANCE, AND WITH STORAGE LATCHES

This application is a continuation-in-part application of a copending application filed on Mar. 13, 1992, Ser. No. 851,080 now U.S. Pat. No. 5,289,411.

TECHNICAL FIELD

The present invention relates to an electrically programmable and erasable memory array device having a plurality of memory cells with each having a floating gate for the storage of charges thereon. More particularly, the present invention relates to such a floating gate memory array device having improved immunity to write disturbance, and with storage latches.

BACKGROUND OF THE INVENTION

Electrically programmable and erasable memory array devices using floating gate for the storage of charges thereon are well known in the art. See, for example, U.S. Pat. No. 4,698,787. In such prior art memory design, the source or ground of the memory array is common to all of the cells or a large portion of the total memory cells. Typically, these types of floating gate memory array devices are termed flash-type EPROM or EEPROM, which can only be erased in a block mode, wherein the complete array or a large portion of the array has to be erased at one time. This is because in this prior art type of memory array device, erasure is induced by raising the ground lines to a very high voltage, typically greater than 10 volts. Since the ground line of the memory array cells are common, every cell in the array is erased.

In U.S. Pat. No. 5,029,130, assigned to the present assignee, which is incorporated herein by reference, a novel type of EEPROM or flash EEPROM memory device is disclosed. In that application, the erase operation can be selectively performed on a single row. However, although the erase operation is selectively performed on a single row, there may be undesired disturbance of the adjacent or nearby unselected cells through the common ground line.

In U.S. patent application Ser. No. 682,459, filed on Apr. 9, 1991, which is also assigned to the present assignee and is incorporated herein by reference, another type of EEPROM memory device is disclosed. In that application, the memory array can be erased on a selective row basis. However, similar to the invention disclosed in U.S. Pat. No. 5,029,130 because erasure is accomplished by high voltage, i.e., greater than 10 volts, the high voltage may disturb the adjacent unselected cells due to the common ground line.

SUMMARY OF THE INVENTION

Accordingly, in one embodiment of the present invention, an electrically programmable and erasable memory device is disclosed. The device comprises a first section and a second section each of which is substantially identical to the other. Each of the first and second sections comprises an array of memory cells with each cell having a floating gate for the storage of charges thereon. The array of memory cells is partitioned into a plurality of logical units with each logical unit having a first plurality and a second plurality of memory cells connected thereto. Each of the first and second sections further has means for selecting a logical unit and for erasing the first and second plurality of memory cells connected to the selected logical unit. Each section further comprises a plurality of latch means. The latch means of a first section is for storing the state of the first plurality of memory cells of the selected logic unit. The latch means of the second section is for storing the state of the second plurality of memory cells of the selected logical unit. Finally, means is provided for programming the floating gate of the memory cells connected to the selected logical unit based upon the state of the latch means in the first and second sections.

In another embodiment of the present invention, the electrically programmable and erasable memory device comprises an array of memory cells with each cell having a floating gate for the storage of charges thereon. Each of the cells further has three terminals. The array of cells is partitioned into a plurality of logical units with each logical unit having a first and a second plurality of memory cells connected thereto. Each of the logical units comprises a plurality of first address lines, a plurality of second address lines, and a third address line. Each of the first plurality of the memory cells has its first terminal connected to a different one of the first address lines, its second terminal connected to the same one of the second address line and its third terminal connected to the third address line. Each of the second plurality of the memory cells has its first terminal connected to a different one of the first address lines, its second terminal connected to the same another of the second address line, different from the one second address line. The third terminal of the second plurality of memory cells is connected to the third address line. The device further comprises means for selecting a logical unit and for erasing the first and second plurality of memory cells connected to the selected logical unit. The device further has a plurality of latch means, and means for storing the state of the first and second plurality of memory cells in the latch means. Finally, the device has means for programming the floating gate of the memory cells connected to the selected logical unit based upon the state of the latch means.

DETAILED DESCRIPTION OF THE DRAWINGS

Figure 1A:
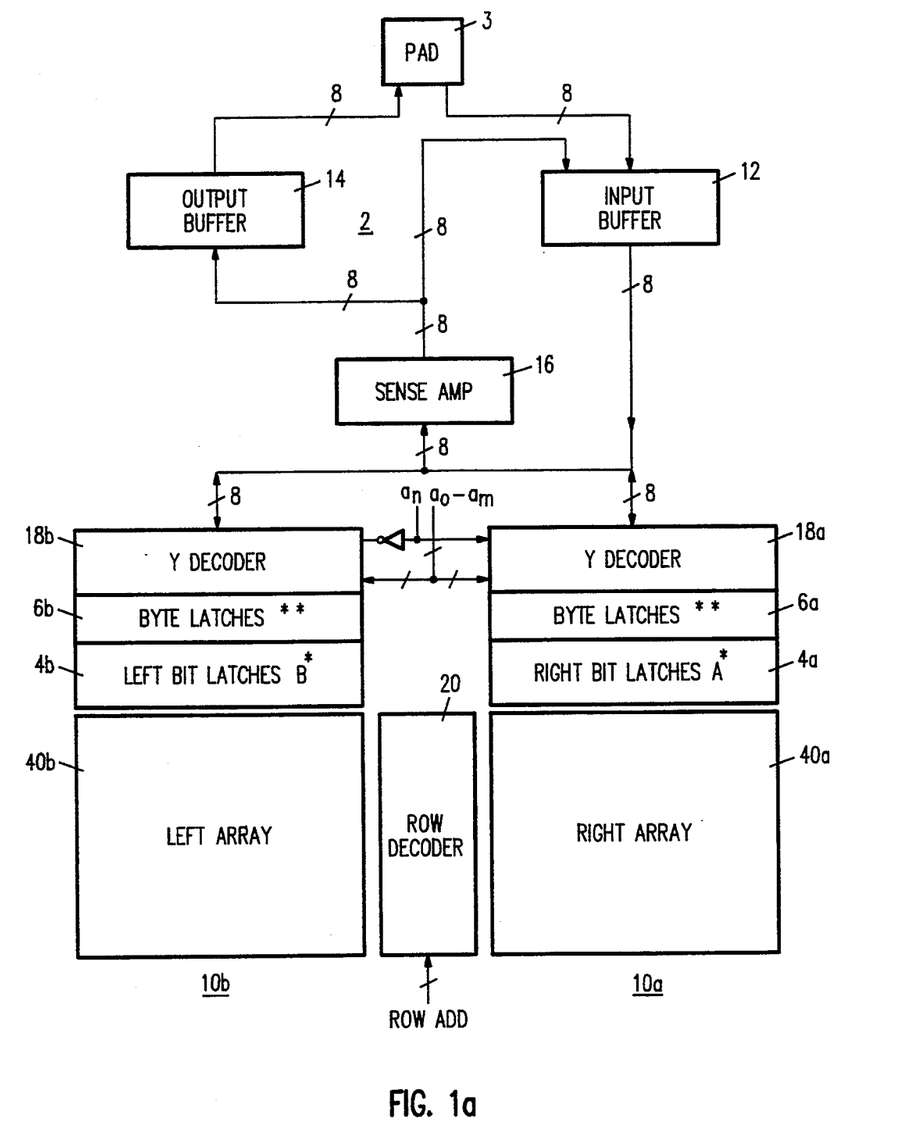
FIG. 1a is a block level diagram of one embodiment of the memory device of the present invention having latches and two substantially identical memory arrays, useful for parallel data transfer between the latches and the arrays.

Referring to FIG. 1a there is shown a block level diagram of one embodiment of a memory device 2 of the present invention. The memory device 2 comprises two substantially identical sections: a first section 10a and a second section 10b. The first section 10a comprise an array 40a of memory cells 42 (to be discussed in greater detail hereinafter). The first section 10a also comprises a column address decoder 18a which receives a plurality of address signals ($a_n$, $a_m$ ... $a_o$). In response to the column address signals supplied to the column address decoder 18a, the column address decoder 18a generates a plurality of address signals which are supplied along the column address lines 26a ... 26m (shown in FIG. 2) to the memory array 40a.

Each of the first section 10a and second section 10b also comprises a plurality of bit latches 4 and a plurality of byte latches 6. Each of the bit latches 4 is connected to one of the column address lines 26a ... 26m, with one bit latch for each column address line. For every 8 bit latches 4, a byte latch 6 is associated therewith. The bit and byte latches 4 and 6 can be of conventional flip-flops or SRAM cells.

A common row address decoder 20 receives a plurality of row address signals and generates the row address signals 24a ... 24n (shown in FIG. 2) which are supplied to the memory array 40a of the first section 10a and to the second array 40b of the second section 10b.

The device 2 also comprises a plurality of input/output pads 3 (only one is shown) for receiving signals exterior to the device 2. In addition, the device 2 comprises an input buffer 12 which receives the 8 signal lines from the input/output pads 3 and stores the 8 bits therein. The output of the input buffer 12 is supplied to each of the first and second sections 10a and 10b, respectively.

Finally, the device 2 also comprises a sense amplifier 16 for receiving the output of the first section 10a and the second section 10b. From the sense amplifier 16, the data is supplied to an output buffer 14 and is also supplied back into the input buffer 12. The output of the output buffer 14 is supplied to the input/output pads 3. The operation of the device 2 will be described hereinafter.

The second section 10b is substantially identical to the first section 10a. Similar to the first section 10a, the second section 10b comprises an array 40b of memory cells 42. The second array 40b receives the plurality of row address signal lines 24a ... 24n which are generated by the common row address decoder 20. In addition, the second section 10b comprises a substantially similar column address decoder 18b. The column address decoder 18b receives the same lower order column address signals $a_o$-$a_m$ as that which is supplied to the column address decoder 18a. However, the most significant bit $a_n$ of the column address signal line is inverted by an inverter and is supplied to the column address decoder 18b as the most significant bit. In this manner, the memory array 40a is addressed by one-half of the address space from the column address signals and the other memory array 40b is addressed by the other half of the address space from the column address signal lines.

Figure 1B:
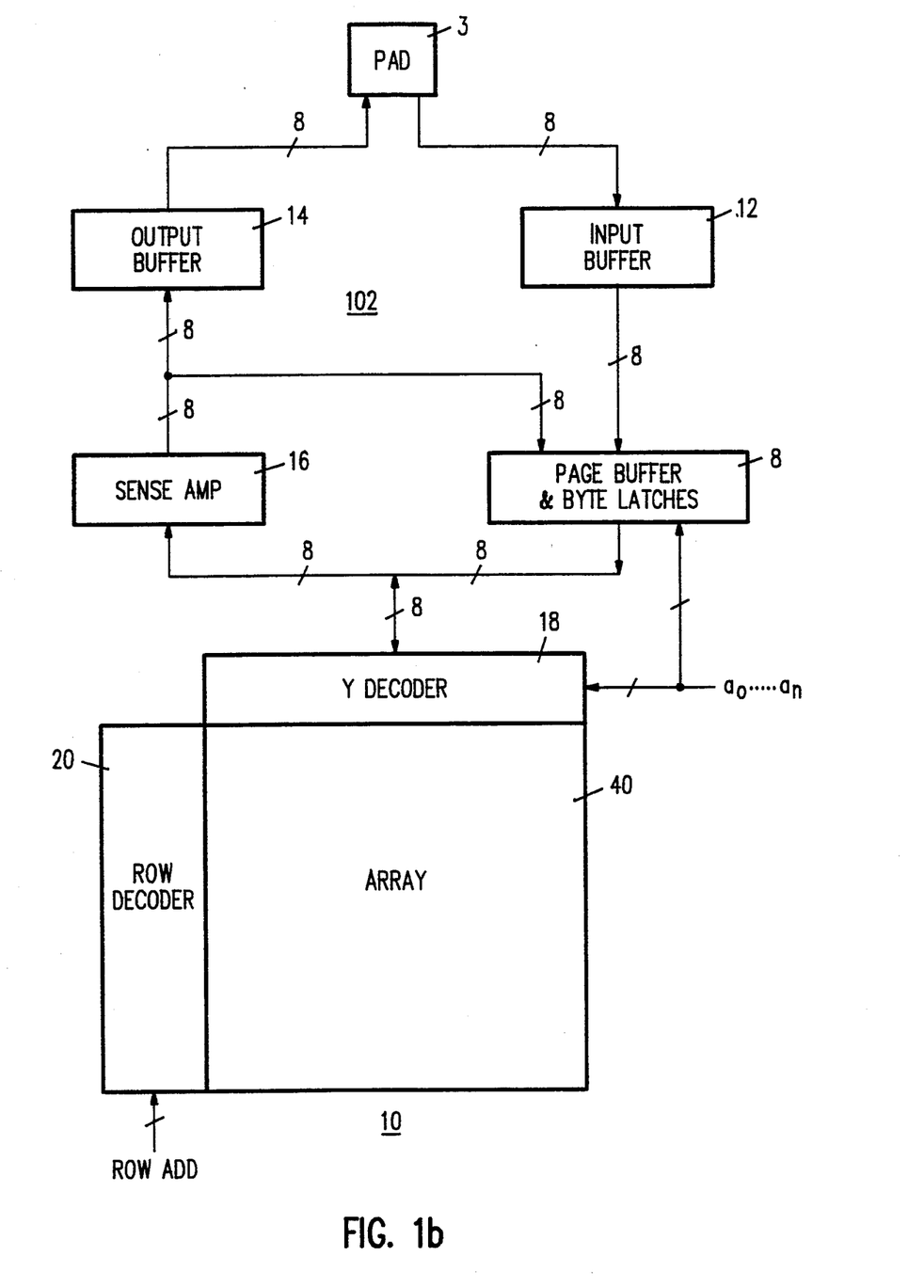
FIG. 1b is a block level diagram of another embodiment of the memory device of the present invention having latches and one memory array, useful for sequential data transfer between the latches and the array.

Referring to FIG. 1b there is shown another embodiment of a memory device 102 of the present invention. The memory device 102, comprises only one section 10.

The section 10 comprises an array 40 of memory cells 42. The section 10 also comprises a column address decoder 18 which receives a plurality of address signals ($a_n$, $a_m$ ... $a_o$). In response to the column address signals supplied to the column address decoder 18, the column address decoder 18 generates a plurality of address signals which are supplied along the column address lines 26a ... 26m (shown in FIG. 2) to the memory array 40.

A row address decoder 20 receives a plurality row address signals and generates the row address signals 24a ... 24n (also shown in FIG. 2) which are supplied to the memory array 40.

The device 102 also comprises a plurality of input/output pads 3 (only one is shown), which functions similarly to that shown in FIG. 1a. From the input/output pads 3, the signals exterior to the device 102 are supplied to an input buffer 12. The output of the input buffer 12 is supplied to a page buffer and byte latches 8. Address signals $a_n$ ... $a_o$ are supplied to page and byte latches 8. The page buffer and byte latches 8 has a portion which serves to store the data and a byte latch portion, similar in function to the byte latches 6, shown in FIG. 1a. The output of the page buffer and byte latches 8 is then supplied to the section 10. The device 102 also comprises a plurality of sense amplifiers 16 which receives as their input the outputs of the section 10. The output of the sense amplifiers 16 is supplied back to the page buffer and byte latches 8 and to the output buffer 14. The output of the output buffer 14 is supplied to the input/output pads 3 and is supplied external to the device 102.

Figure 2:
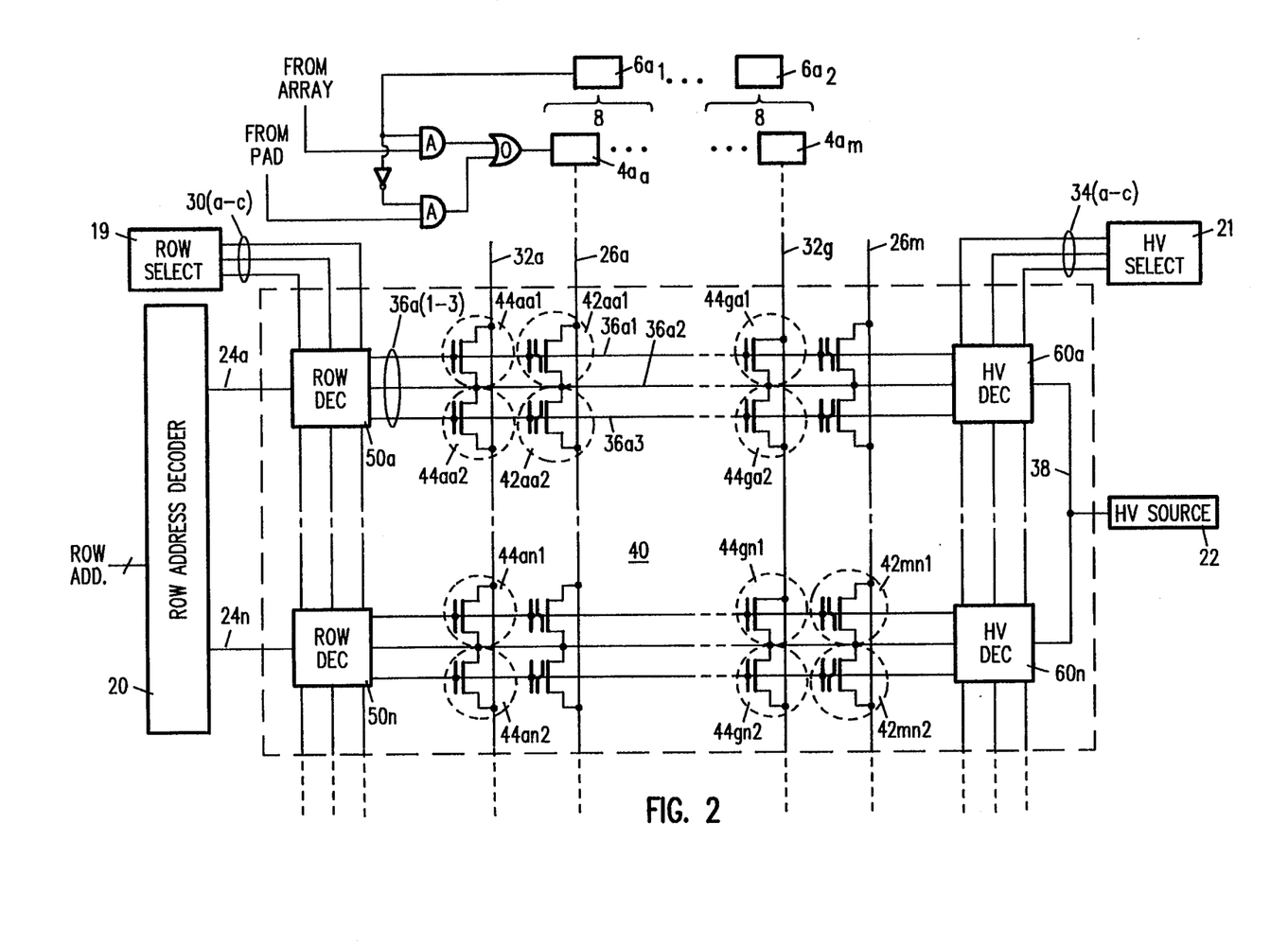
FIG. 2 is a circuit diagram of the electrically programmable and erasable memory array portion of the device shown in FIG. 1.

Referring to FIG. 2 there is shown a circuit diagram of the memory array 40 portion of the device 2 of the present invention. The memory array 40 comprises an array of floating gate memory cells 42, which will be described hereinafter.

The array 40 comprises a plurality of column address lines $26_{(a-m)}$ which receive column address signals thereon supplied from the column address decoder 18. The plurality of column address lines $26_{(a-m)}$ are substantially parallel to one another. In addition, the array 40 comprises a plurality of row address lines $24_{(a-n)}$ which receive row address signals generated by the row address decoder 20. The plurality of row address lines $24_{(a-n)}$ are also substantially parallel to one another and are substantially perpendicular to the plurality of column address lines $26_{(a-m)}$. The plurality of row address lines $24_{(a-n)}$ and column address lines $26_{(a-m)}$ form an array. Finally, the array 40 comprises a source of high voltage 22 which provides a high voltage potential necessary to program or to store charges on the floating gate of the memory cells 42 in the array 40 or to erase the charges on the floating gate of the memory cells 42 in the array 40.

As previously discussed, the memory array 40 comprises a plurality of memory cells 42, each of which has a floating gate for the storage of charges thereon. The memory cells 42 are arranged in an array 40. Associated with each row address line 24 and each column address line 26 are two memory cells $42_{xy1}$ and $42_{xy2}$ (wherein x denotes the column address line and y denotes the row address line).

Each row address line 24 is connected to a row decoding circuit 50 (which will be described in detail hereinafter). The row decode circuit 50 also receives three row select lines $30_{(a-c)}$ generated by the row select decoder 19. The output of the row decode circuit 50 is a plurality of row lines 36$_{y(1-3)}$, where y denotes the row address line 24 which caused the generation of the three row lines 36$_{y(1-3)}$. At the intersection of each of the three row lines 36 and one of the column address lines 26 are two memory cells 42.

The memory cells 42 can be of the type described in U.S. Pat. No. 5,029,130, or Ser. No. 682,459, filed on Apr. 9, 1991, which are incorporated herein by reference. Each of the memory cells 42 is a single transistor floating gate memory cell having a source, a drain and a gate. As is well known in semiconductor circuit technology, the term source and drain can be used interchangeably. As described in those applications, the memory cell programs by the mechanism of hot electron injection from the drain (or source) to the floating gate, and erases by the mechanism of Fowler-Nordheim tunnelling from the floating gate to the control gate.

In the preferred embodiment, each of the memory cells 42 is of the type described in copending U.S. application Ser. No. 682,459, filed on Apr. 9, 1991. As described in that application, each of the memory cells 42 has the following characteristics.

|         | DRAIN | GATE  | SOURCE |
|---------|-------|-------|--------|
| PROGRAM | 0/+5  | $V_t$ | +12    |
| ERASE   | 0     | +15   | 0      |
| READ    | +2    | +5    | 0      |

The interconnection of each of the memory cells 42 to the row lines 36$_{y(1-3)}$ and the column address line 26 is as follows:

The drain of memory cells 42$_{xy1}$ and 42$_{xy2}$ are connected to the column address line 26. The source of the memory cells 42$_{xy1}$ and 42$_{xy2}$ are both connected to the row line 36$_{y2}$ (which shall be hereinafter designated as the common line). The gate of the memory cell 42$_{xy1}$ is connected to the row line 36$_{y1}$. The gate of the memory cell 42$_{xy2}$ is connected to the row line 36$_{y3}$.

Each of the three row lines 36$_{(a-n)(1-3)}$ is also connected to a high voltage decode circuit 60. The high voltage decode circuit 60 (which is shown in greater detailed in FIG. 3) also receives three HV select signals 34$_{(a-c)}$ generated by the HV Row Select Decoder 21. The input of each HV decode circuit 60 is the HV line 38 connected to the plurality of HV decode circuits 60 and to a source of high voltage 22.

Finally, the memory array 40 comprises a plurality (such as 8 or 16) of common ground lines 32$_{(a-g)}$, repeated for every fixed number of column lines 26. The common ground lines 32 are substantially parallel to the plurality of column address lines 26$_{(a-m)}$ and are substantially perpendicular to the plurality of row lines 36$_{(a-n)(1-3)}$. The common ground lines 32 intersect each of the row lines 36$_{y(1-3)}$. At the intersection of each common ground line 32 with each of the row lines 36$_y$ are two switch transistor 44$_{xy(1-2)}$. The manner of connecting the switch transistor 44$_{xy(1-2)}$ to the row lines 36$_{y(1-3)}$ and to the common ground line 32 is as follows.

The gate of the switch transistor 44$_{xy1}$ is connected to the row line 36$_{y1}$. The gate of the switch transistor 44$_{xy2}$ is connected to the row line 36$_{y3}$. The source (or the drain) of the switch transistors 44$_{xy1}$ and 44$_{xy2}$ are both connected to the common line 36$_{y2}$. Finally, the drain (or the source) of the switch transistors 44$_{xy1}$ and 44$_{xy2}$ are connected to the common ground line 32.

Figure 3:
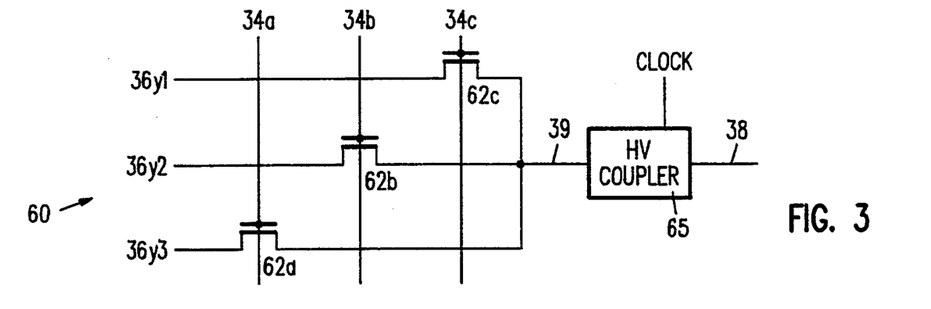
FIG. 3 is a circuit diagram of the high voltage decode circuit portion associated with each row of the memory array shown in FIG. 2.

Referring to FIG. 3 there is shown in greater circuit detail one embodiment of the HV decode circuit 60. As previously stated, the HV decode circuit 60 is connected to the row lines 36$_{y(1-3)}$, which are substantially parallel to one another. In addition, the HV decode circuit 60 receives a plurality of HV row select lines 34$_{(a-c)}$ which are substantially parallel to the column address lines 26$_{(a-m)}$, which are substantially perpendicular to the row lines 36$_{y(1-3)}$.

At the intersection of each of the HV select line 34$_{(a-c)}$ and the row lines 36$_{y(1-3)}$ is a switch transistor 62$_{(a-c)}$. The gate of each of the switch transistor 62 is connected to one of the HV select lines 34$_{(a-c)}$. The source (or the drain) of each of the switch transistors 62 is connected to the row line 36$_y$. The drain (or the source) of each of the switch transistors 62$_{(a-c)}$ are all connected together to the output line 39 of a high voltage coupler 65, which is connected to the output 38 of the high voltage source 22.

Figure 4:
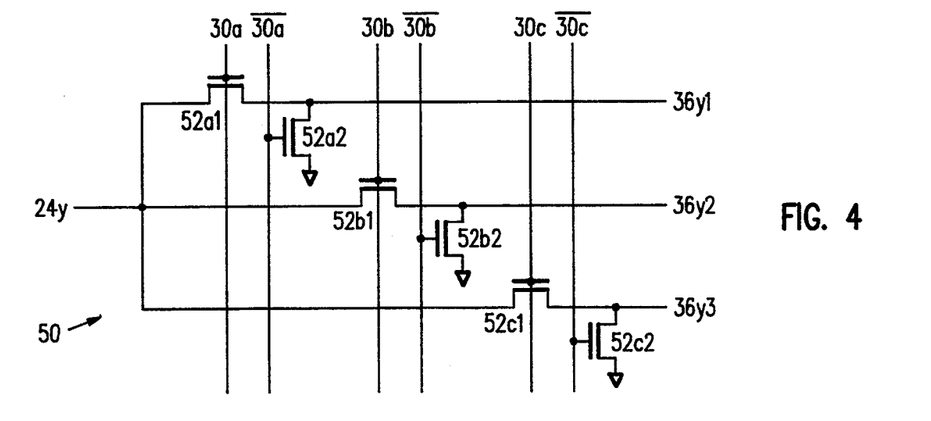
FIG. 4 is one embodiment of a circuit diagram of the row decode circuit portion of the memory array device shown in FIG. 2.

Referring to FIG. 4 there is shown one embodiment of the row decode circuit 50. The row decode circuit 50 receives a single row address line 24$_y$ and a plurality of row select lines 30$_{(a-c)}$ and generates as its output the three row lines 36$_{y(1-3)}$. In the embodiment shown in FIG. 4, the inverse of the row select lines 30$_{(a-c)}$, i.e., $\overline{30}_a$, $\overline{30}_b$, and $\overline{30}_c$, are also provided. At the intersection of each of the row lines 36$_{y(1-3)}$ with each of the row select lines 30$_{(a-c)}$ is a switch transistor 52$_{(a-c)1}$. At the intersection of each of the row lines 36$_{y(1-3)}$ and each of the inverse to the row select lines 30$_{(a-c)}$ is another plurality of switch transistors 52$_{(a-c)s}$.

The function of the transistors 52$_{(a-c)2}$ is to discharge the unselected row line 36$_y$. Thus, for example, if row address line 24$_y$ is high and row select line 30a is high, transistor 52$_{a1}$ is turned on thereby bringing row line 36$_{y1}$ high. At the same time, row select line $\overline{30}_b$ and $\overline{30}_c$ are both high. They will turn on transistors 52$_{b2}$ and 52$_{c2}$ which would bring down the row lines 36$_{y2}$ and 36$_{y3}$, the unselected row lines. Thus, in this embodiment when one of the row lines 36 is selected by the row select lines 30$_{(a-c)}$ the other two unselected row lines 36 will be held at ground potential. Of course, as will be seen, it is also possible to discharge only one of the three row lines 36 to bring it to ground potential, leaving the other two row lines 36 at high potential.

Figure 5:
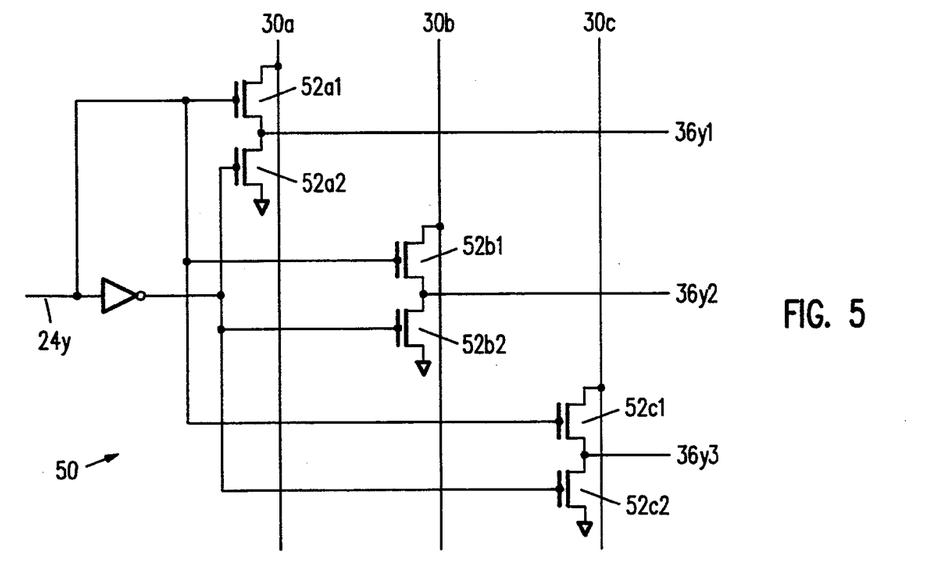
FIG. 5 is a preferred embodiment of a circuit diagram of the row decode circuit portion of the memory array device shown in FIG. 2.

Referring to FIG. 5 there is shown a preferred embodiment of the row decode circuit 50. In the embodiment shown in FIG. 5, if one of the row lines 36$_{y(1-3)}$ is selected, the unselected row line 36 may be maintained at a potential other than ground potential. The manner of accomplishing is as follows. When row address line 24$_y$ is activated, all of the transistors 52$_{(a-c)}$ are turned on. This would bring row line 36$_{y1}$ to the voltage potential present on the row select line 30$_a$. Row line 36$_{y2}$ would be brought to the voltage potential present on row select line 30$_b$. Row line 36$_{y3}$ would be brought to the potential on the row select line 30$_c$. The voltages on the row select lines 30a, 30b and 30c can vary.

OPERATION OF THE MEMORY ARRAY 40

As previously stated, in the preferred embodiment, each of the memory cells 42 is of the type described in U.S. patent application Ser. No. 682,459, filed on Apr. 9, 1991, and has the programming, erase and read voltage characteristics discussed heretofore. The drain of each memory cell 42 is connected to a column address line 26, the gate of each memory cell 42 is connected to a row line 36$_y$ or 36$_{y3}$, and the source of each memory cell 42 is connected to the common line 36$_{y2}$. With respect to each of the operations, the array 40 functions as follows:

ERASE

When it is desired to erase a particular row $24_y$, the particular row address line 24 from the row address decoder 20 is activated. For the purpose of this discussion we shall assume that row address line $24_a$ is activated. We shall also assume that all of the memory cells 42 whose gate is connected to the row line $36_{1a}$ is to be erased. Finally, we shall assume that the row decode circuit $50_a$ is of the type shown in FIG. 5.

Thus, when row address line $24_a$ is activated, row select line $30_a$ is also high, with row select line $30_b$ and $30_c$ being held at ground potential. Thus, this results in row line $36_{a1}$ being high with row lines $36_{a2}$ and $36_{a3}$ being at ground potential. The high potential on row line $36_{a1}$ would turn on transistor $44_{aa1}$ connecting the common ground line 32 to the common line $36_{a2}$. Within the HV decode circuit 60, HV select line $34_c$ would be high turning on transistor $62_c$. Node 39 will then be raised high, i.e. one threshold below $V_{cc}$ and activate the high voltage coupler 65. Thus, row line $36_{a1}$ would then be connected to the high voltage source 22 which supplies a potential of +15 volts to the gate of each of the memory cells $42_{aa1}$, $42_{ba1}$. This would cause all the memory cells 42 whose gate is connected to the row line $36_{a1}$ to be brought to +15 volts.

All of the column address lines $26_{(a-m)}$ would be brought to ground potential thereby bringing the drain of each of the memory cells 42 to ground potential. Finally, since in most semiconductor memory circuits the common line $36_{a2}$ is made of conductive diffusion line, a fairly resistive element, the grounding of the common line $36_{a2}$ through transistor $44_{aa1}$ onto the common ground lines 32 would further bring the source of each of the memory cells $42_{xa1}$ to ground. Of course the common line $36_{a2}$ can also be made of metal, silicide or polycide. The common ground lines 32 are made of metal, and provides for greater conductance to a ground potential.

In this operation, the effect on the adjacent row of memory cells $42_{xa2}$ is as follows:

Drain-ground potential
Gate-ground potential
Source-ground potential

With all three terminals of the adjacent row of memory cells 42 being grounded, the effect or the disturbance on the state of the adjacent memory cells is non-existent.

With respect to the disturbance on the other rows of memory cells 42, such as row $24_n$, the voltage on the memory cells 42 are as follows:

Drain-ground potential
Gate-ground potential
Source-ground potential

Again, since all three terminals of the cell are grounded, there is no disturbance on the charging state of the floating gate.

In addition, as will be seen, it is desirable during the erase mode to erase all of the memory cells $42_{aa1}$ .. $42_{ma1}$ .. $42_{aa2}$ .. $42_{ma2}$ connected to a particular row line, e.g., $24_a$. In this mode, row select lines $30_a$ and $30_c$ are brought to high, with row select line $30_b$ held at ground potential. Thus, if row address line $24_a$ is activated, row select lines $30_a$ and $30_c$ are high, then this results in row line $36_{a1}$ and $36_{a3}$ being high with row line $36_{a2}$ being at ground potential. The high potential on row line $36_{a1}$ or $36_{a3}$ would turn on transistors $44_{(a-m)a(l-2)}$ connecting the common ground line 32 to the common line $36_{a2}$. Within the HV decode circuit 60, HV select lines $34_a$ and $34_c$ would be high turning on transistors $62_a$ and $62_c$. Node 39 will then be raised high, i.e. one threshold below $V_{cc}$ and activate the high voltage coupler 65. Thus row lines $36_{a1}$ and $36_{a3}$ would then be connected to the high voltage source 22 which supplies a potential of +15 volts to the gate of each of the memory cells $42_{aa1}$, $42_{ba1}$ ... $42_{ma1}$ connected to row line $36_{a1}$ and the gate of the memory cells $42_{aa2}$, $42_{ba2}$ ... $42_{ma2}$ connected to row line $36_{a3}$.

All of the column address lines $26_{(a-m)}$ would be brought to ground potential thereby bringing the drain of each of the memory cells to ground potential. The source of each of the memory cells, connected to row line $36_{a2}$ to the common ground line 32, would also be at ground potential. With this connection, all the memory cells addressed by row address line $24_a$ would be erased together.

PROGRAMMING

In the programming mode, we shall assume once again that the memory cells $42_{(a-m)a1}$ are to be programmed. The selected row address line $24_a$ is brought the potential of $V_{cc}$. This would turn on transistor $52_{a1}$. The row select line $30_a$ is brought to the potential of $V_t$, row select line $30_b$ is brought to $V_{cc}$ and $30_c$ is maintained at ground potential. The $+V_t$ volts on the row select line $30_a$ is passed to the row line $36_{a1}$, and $V_{cc}-V_t$ is passed to $36_{a2}$.

The HV select line $34_b$ is brought to a voltage potential sufficient to turn on transistor $62_b$. HV select lines $34_a$ and $34_c$ are maintained at ground potential. This connects the row line $36_{a2}$ to node 39. The voltage of node 39 is raised to $V_{cc}-V_t$ which activates the voltage coupler 65. Thus, a voltage potential of approximately 12 volts is supplied to the source of each of the memory cells $42_{(a-m)a1}$.

In this manner, the selected memory cell 42 is programmed when the associated column address line 26 is brought to ground potential or a low voltage dictated by the programming requirement. If the memory cell 42 is not desired to be programmed, the associated column address line 26 is brought to a potential of approximately +5 volts.

The disturbance on the unselected cells are as follows:

For the memory cells 42 in the same row, the voltages on the memory cells 42 are as follows:

DRAIN: +5 volts
GATE: +$V_t$
SOURCE: +12 volts

Since the drain voltage of the unselected cell is 5 volts and the gate is $V_t$, the cell is cut-off and there is some, but negligible, disturbance. With such a small disturbance, it is possible to design a product to withstand its impact throughout the specified product life.

For the memory cells 42 in the immediate adjacent row 24, the voltages on the memory cells 42 are as follows:

SOURCE: +12 Volts
GATE: 0 volt
DRAIN: 0 Volts or a low voltage in selected columns and +5 Volts in unselected columns Under these conditions, these cells 42 in the row immediately adjacent to the selected row could have some but negligible effect of programming disturbance, because the gate voltage is at ground. Again, with such small disturbance, it is possible to design a product to withstand its impact throughout the specified product life.

With respect to other unselected cells, i.e., cells 42 in row other than the immediate adjacent row, e,g, row $24_n$, the potential on the cells are as follows:
DRAIN: +5 Volts or 0 volts to a low voltage
GATE - ground potential
SOURCE - ground potential In this condition, since there is no high voltage present on any of the unselected cells 42 in these other rows, there is no disturbance on any of these cells.

READ

Finally, since the voltage required to read the cells are typically on the order of +2 volts and +5 volts, low voltages, the read disturbance is also negligible in the unselected cells.

Although the invention has been described in the preferred embodiment as using the floating gate memory cell 42 as disclosed in U.S. patent application Ser. No. 682,459, filed on Apr. 9, 1991, the floating gate memory cell 42 as disclosed in U.S. Pat. No. 5,029,130 can also be used. In that application, the floating gate memory cell 42 have the following characteristics for operation.

|  | DRAIN | GATE | SOURCE |
| --- | --- | --- | --- |
| PROGRAM | +12 | $+V_t$ | 0 |
| ERASE | 0 | +15 | 0 |
| READ | +2 | +5 | 0 |

To use such a floating gate memory cell 42 in the array 40, the drain can be connected to the common line $36_{y2}$, the gate connected to the appropriate row line 36, and the source connected to the column address line 26.

As can be seen from the foregoing, by having a plurality of common lines, and further having additional row decode circuits and high voltage decode circuits, the high voltage source can be applied and the write disturbance can be limited to a particular row. Of course, the row decode circuit 50 and HV decoder circuit 60 can be made a part of the row address decoder 20.

The operation of the device 2 will now be explained:

Each of the arrays 40a or 40b is divided into a plurality of logical units with a logical unit being defined as the memory cells 42 connected to a particular row, e.g., 24a. Thus, each logical unit has a first plurality of memory cells 42 connected thereto comprising of memory cells $42_{aa1} \ldots 42_{am1}$, and a second plurality of memory cells comprising of memory cells $42_{aa2} \ldots 42_{am2}$. In the programming phase, the desired data to be written into any particular logical unit or a portion thereof is first supplied to the input/output pads 3. Assume for the moment that all of the bits of a particular logical unit are to be replaced by the new data. A first plurality of bits, a number equal to the number of memory cells $42_{aa1} \ldots 42_{am1}$ are supplied to the memory device 2 through the input/output pads 3 and are stored in the bit latches 4a of the first section 10a. The corresponding byte latches 6a, which are reset to "1" before the programming operation, are set to "0". The second plurality of data bits are supplied to the memory device 2 into the input buffer 12 and into the bit latches 4b of the second section 10b. Similarly, the corresponding byte latches 6b, which are reset to "1" before the programming operation, are set to "0".

In the event only certain bytes of a particular logical unit are to be reprogrammed, the byte latch 6a associated with the byte all of whose bits from the first plurality of memory cells 42 are not to be altered are not set to "0" and remain at the reset state of "1". The byte latch 6a associated with the byte having one or more of the bits to be reprogrammed is set to "0". Similarly associated byte latch 6b for each of the 8 bits 4b are set. All of the data from the selected logical unit of the selected array are then read out or recalled and are supplied to the bit latches 4a. Each of the bit data is gated through a logic gate whose other input is the output of the associated byte latch 6a. Thus, a byte latch 6a set to a "0" prevents the data from the logical unit being stored in the associated bit latch 4a, while a state of "1" gates the data from the logical unit into the bit latch 4a. Once all the bit latches (4a or 4b) have been stored with (1) the data supplied external to the device 2, and (2) the data recalled from the bytes of the selected logical unit of the array which are not to be altered, the logical unit is then erased with the first plurality and the second plurality of memory cells erased together.

Thereafter, the data stored in the bit latches 4a of the first section 10a are then written into the first plurality of memory cells 42 of the logical unit erased. The data from the bit latches 4b of the second section 10b are then read out from the section 10b and input back into bit latches of the first section 10a, one byte at a time, and is then used to program the second plurality of memory cells $42_{aa2} \ldots 42_{am2}$. In this manner the entire memory cells of the erased logical unit is then reprogrammed.

In the preferred embodiment, each of the arrays 40 comprises 512×1024 memory cells with 512 column lines. Thus, there would be 512 bit latches 4a and 64 byte latches 6a.

As for the operation of the memory device 102, the device 102 operates similar to the device 2. Here again, the array of memory cells 40 is divided into plurality of logical units with each logical unit comprising of a first plurality of memory cells $42_{aa1} \ldots 42_{am1}$ and a second plurality of memory cells $42_{aa2} \ldots 42_{am2}$. The page buffer and byte latches 8 has sufficient storage for the sum of the first plurality and second plurality of memory cells. Thus, in the preferred embodiment, the page buffer comprises of 1024 bits with 128 byte latches, with one byte latch associated with each 8 bits.

As discussed for the memory device 2, in the event an entire logical unit is to be reprogrammed, the data is first written into the page buffer 8 of the memory device 102. All of the byte latches 6a will be set to "0". The content of the bit latches 4a will not be altered by the subsequent recall process. The selected logical unit comprising a first plurality of memory cells and a second plurality memory cells are erased simultaneously. The data stored in the page buffer 8 is then supplied one byte at a time to the array 40 and written into the erased logical unit.

In the event fewer than an entire logical unit is to be altered, as with the memory device 2, the byte latches 6a of the bytes which are not to be altered will remain at the reset state of "1". During the subsequent recall process, each byte of the selected logical unit is read out and the data is stored in the page buffer 8 if the corresponding byte latch state is "1". Once all the data has been written into the page buffer 8, the logical unit is then erased. Thereafter, the data stored in the page buffer 8 is supplied to the array 40, one byte at a time, to reprogram the erased logical unit.

There are a number of considerations for a choice of either device 2 or device 102. In the embodiment shown in FIG. 1a, the device 2 has a parallel transfer in which the bits from the bit latches 4 are supplied in parallel to one half of the memory cells of a logical unit. Thus, the programming time may be shorter and as a result, the amount of disturbance can be lower.

The factors favoring the embodiment shown in 1b is that it is less complex than the embodiment shown in FIG. 1a. Furthermore, since this is not parallel transfer, data is written into the array 40 one byte at a time, the amount of current required for programming is less than that shown for the embodiment in FIG. 1a. Thus, the on-board charge pump necessary for the device 102 is smaller than the device 2 shown in FIG. 1a. In addition, although in the operation of device 102 data is affected serially, the programming time can be shorter for each byte of programming if a larger charge pump were used which can output a higher current. Thus, there is a tradeoff between the embodiment shown in FIG. 1a and the embodiment shown in FIG. 1b.

What is claimed is:

1. An electrically programmable and erasable memory device comprising:
   a first section and a second section each of which is substantially identical to the other; each of said first section and said second section comprising
   an array of memory cells each cell having a floating gate for the storage of charges thereon; said array of cells partitioned into a plurality of logical units with each logical unit having a first and a second plurality of memory cells connected thereto;
   means for selecting a logical unit and for erasing the first and second plurality of memory cells connected to the selected logical unit;
   a plurality of bit latch means;
   means for storing the state of the first plurality of memory cells connected to the selected logical unit in said first section, in the bit latch means of said first section and
   for storing the state of the second plurality of memory cells connected to the selected logical unit in said first section, in the bit latch means of said second section; and
   means for programming the floating gate of the first and second plurality of memory cells connected to the selected logical unit in said first section based upon the state of the bit latch means in the first section, and the state of the bit latch means in the second section.

2. The device of claim 1 wherein each of the memory cells has three terminals; and wherein each logical unit comprising:
   a plurality of first address lines;
   a plurality of second address lines;
   a third address line;
   and wherein each of the first plurality of said memory cells has its first terminal connected to one of said plurality of first address lines different from one another, its second terminal connected to a first same second address line, and its third terminal connected to the third address line; and wherein each of the second plurality of said memory cells has its first terminal connected to one of said plurality of first address lines different from one another, its second terminal connected to a second same second address line said second same second address line different from the first same second address line, and its third terminal connected to the third address line.

3. The device of claim 2 further comprising:
   high voltage source means for supplying a high voltage source;
   wherein said selecting means connects the second address lines of the selected logical unit to said high voltage source means to cause erasure of charges on the floating gate of the memory cells whose second terminals are connected to the second address lines; and
   wherein said programming means connects the third address line of the selected logical unit to said high voltage source means to cause programming of charges on the floating gate of the memory cells whose third terminals are connected to the third address line.

4. The device of claim 3 further comprising:
   a grounding line, substantially parallel to said plurality of first address lines, intersecting each of said third address lines;
   switch means for connecting each of said third address lines to said grounding line.

5. The device of claim 4 wherein said switch means further comprises:
   a plurality of transistor means, each for connecting a third address line to said grounding line.

6. The device of claim 3 wherein said first address lines are column address lines, said second address lines are row address lines and said third address lines are common address lines, and wherein each combination of one of the plurality of column address lines and one of the plurality of row address lines define a different one of the plurality of memory cells.

7. The device of claim 6 wherein said plurality of column address lines are substantially parallel to one another and said plurality of row address lines are substantially parallel to one another with said column address lines substantially perpendicular to said row address lines.

8. The device of claim 7 wherein each of said plurality of common address lines has an associated row address line, is substantially parallel thereto, and connects to the third terminal of the memory cells to which the associated row address line is connected.

9. The device of claim 7 wherein each of said plurality of common address lines has two associated row address lines, is positioned therebetween and is substantially parallel thereto, and said common address line connects to the third terminal of the memory cells to which the associated row address lines are connected.

10. The device of claim 9 further comprising:
    a grounding line substantially parallel to said plurality of column address lines, intersecting each of said common address lines;
    switch means for connecting each of said common address lines to said grounding line.

11. The device of claim 10 wherein said switch means further comprises:
    a plurality of transistor means each for connecting a common address line to said grounding line, each of said transistor means further comprises:
    a source connected to said grounding line;
    a drain connected to said common address line; and a gate connected to the associated row address line.

12. The device of claim 11 wherein said grounding line is made of metal.

13. The device of claim 12 wherein each of said common address lines is made of polysilicon.

14. The device of claim 1 further comprising:
a plurality of byte latch means, with each byte latch means corresponding to a group of bit latch means; each of said byte latch means having a first state and a second state;

means for setting the state of a byte latch means in the first state in the event all of the associated bit latch means is for storing the state of the first plurality of memory cells as supplied from said first plurality of memory cells; and means for setting the state of a byte latch means in the second state in the event any of the associated bit latch means is for storing the state of the first plurality of memory cells, as supplied externally from said memory device.

15. The device of claim 14 wherein each byte latch means corresponds to eight (8) bit latch means.

* * * * *